United States Patent [19]

Inoue et al.

[11] Patent Number: 4,814,284
[45] Date of Patent: Mar. 21, 1989

[54] GAAS PLANNAR DIODE AND MANUFACTURING METHOD THEREFOR

[75] Inventors: Kazuhiko Inoue; Yutaka Tomisawa, both of Yokohama, Japan

[73] Assignee: Kabushiki Kaisha Toshiba, Kawasaki, Japan

[21] Appl. No.: 111,288

[22] Filed: Oct. 22, 1987

[30] Foreign Application Priority Data

Oct. 27, 1986 [JP] Japan .................. 61-253864

[51] Int. Cl.$^4$ .................. H01L 21/265; H01L 29/91
[52] U.S. Cl. .................. 437/022; 437/027; 437/061; 437/904
[58] Field of Search .................. 437/22, 23, 27, 61, 437/62, 904, 905

[56] References Cited

U.S. PATENT DOCUMENTS

| | | | |
|---|---|---|---|
| 3,986,192 | 10/1976 | Di Lorenzo et al. | 357/13 |
| 4,064,620 | 12/1977 | Lee et al. | 437/27 |
| 4,381,952 | 5/1983 | Rosen | 437/22 |
| 4,728,616 | 3/1988 | Ankri et al. | 437/22 |

FOREIGN PATENT DOCUMENTS

0054648 6/1982 European Pat. Off. .......... 437/22

57-37827 3/1982 Japan .................. 437/22

OTHER PUBLICATIONS

D'Avanzo, "Proton Isolation for GaAs Integrated Circuits," IEEE Transactions on Electron Devices, vol. 29, No. 7, p. 1051, Jul. 1982.

Primary Examiner—Olik Chaudhuri
Attorney, Agent, or Firm—Finnegan, Henderson, Farabow, Garrett, & Dunner

[57] ABSTRACT

A GaAs planar diode includes an N type GaAs substrate having an N+ GaAs layer on which an N− GaAs layer is formed. A first impurity layer of the N+ type is formed on the N$^{31}$ GaAs layer. A second impurity layer of a p+ type is formed on the first impurity layer, wherein a p-n junction is formed between the first and second impurity layers. A semi-insulation region, for encompassing a predetermined area of the p-n junction of the first and second impurity layers, is formed in the substrate. The depth of the semi-insulation region in the substrate is deeper than the total depth of the first and second impurity layers, so that the semi-insulation region serves as an element isolation region of the p-n junction of the first and second impurity layers.

7 Claims, 3 Drawing Sheets

GAAS PLANNAR DIODE AND MANUFACTURING METHOD THEREFOR

BACKGROUND OF THE INVENTION

The present invention relates to a GaAs planar p-n junction diode and the manufacturing method therefor, and more particularly, to an element isolation technique of a variable capacitor (varicap) diode by means of implanting ions of impurity atoms which renders an element isolation region of the varicap diode to be semi-insulative.

A varicap diode uses a depletion layer capacitance obtained by reversely biasing the p-n junction thereof. The depletion layer capacitance depends on the value of the reverse p-n junction bias. Quality factor Q of such a varicap can be expressed as:

$$Q = 1/(2\pi f \, C_j \, r_s) \qquad (1)$$

where f denotes a frequency; $C_j$, a junction capacitance; and $r_s$, an effective series resistance of the junction.

Equation (1) teaches that a large quality factor Q requires a small series resistance $r_s$. Since a prominent reduction in series resistance $r_s$ can be achieved by a GaAs substrate, but it cannot be achieved by a Si substrate, a GaAs varicap diode having an excellent mass productivity and a specific manufacturing method therefor have been demanded.

There are two types of GaAs varicap diodes. One is a mesa type and the other is a planar type using a selective ion implantation.

FIG. 4 shows a conventional structure of a planar diode wherein substrate 1 is formed of high-concentration N+ type GaAs substrate 1a on which low-concentration N− layer 1b is epitaxially grown. First impurity layer 2 of a high-concentration N+ type formed in epitaxial layer 1b has a prescribed area for obtaining a desired junction capacitance. Second impurity layer 3 of a high-concentration P+ type is stacked onto N+ layer 2, such that P+ layer 3 has a depth thinner than that of N+ layer 2 and has an area larger than that of N+ layer 2. Electrode 4 contacts in ohmic with P+ layer 3. Other electrode 5 is connected to the back plate of substrate 1a.

A conventional planar varicap diode as shown in FIG. 4 can be made by manufacturing steps illustrated in FIG. 5. First, as shown in FIG. 5(a), substrate 1 is prepared so that epitaxial low-concentration GaAs N− layer 1b is formed on high-concentration GaAs N+ layer 1a. Next, as shown in FIG. 5(b), ion implantation mask 2a is formed on substrate 1. Using this mask, a selective ion implantation of Si and annealing thereof are performed so that high-concentration N+ type first impurity layer 2, having an area for the desired junction capacitance, is formed. In this case, SiO$_2$, PSG, or a resist formed on SiO$_2$ or PSG, is used for the material of mask 2a. Then, as shown in FIG. 5(c), ion implantation mask 3a, having an opening slightly larger than the area of mask 2a, is again formed on substrate 1, and mask 3a is overlaid on layer 2 so that high-concentration P+ type second impurity layer 3, having a smaller depth than N+ layer 2, is formed by a selective ion implantation of Zn and annealing thereof. Finally, as shown in FIG. 5(d), ohmic electrode 4 connected to P+ layer 3 is formed by a conventional lift-off method or etching method, and back plate electrode 5, ohmic-contacted to substrate 1a, is formed by a conventional evaporation method and alloy method.

In a planar type varicap manufactured by the above method, the operation area of the varicap is formed by a selective ion implantation. The capacitance vs. reverse-bias voltage characteristic (C-V characteristc) of this varicap has a problem of so-called "C drift". The C drift means that the capacitance of the varicap is unsuitably varied even if the reverse-bias voltage thereof is fixed at a constant value.

For a varicap, the rate of change of its capacitance should exactly and stably depends on that of its reverse-bias voltage. Thus, said C drift is a large problem for a mass-produced planar type varicap diode. This problem can be generally applied to a p-n junction diode structure because a p-n junction has a voltage-dependent capacitance.

SUMMARY OF THE INVENTION

It is accordingly an object of the present invention to provide a planar type GaAs p-n junction diode which is free of the above-mentioned C drift.

Another object of this invention is to provide a method for manufacturing a C drift-free p-n junction diode in which an improvement is made for a mask forming process used to perform a selective ion implantation.

The inventors of this patent application have discovered that said C drift problem is caused by stress appearing in the film of a mask which is used for performing a selective ion implantation for the varicap operating area.

To achieve the former object, in a GaAs p-n junction diode according to the present invention, an element isolation region of the diode is obtained by rendering a non-selectively formed low resistivity layer to be semi-insulative. This non-selective formation of the element isolation region requires no mask, thus avoiding the problem of said C drift caused by stress in a mask film.

To achieve the latter object, in a manufacturing method of this invention, a whole area of a wafer is ion-implanted using, for example, Si and Zn for a varicap operating region, without a masking film. The element isolation for the varicap diode is performed by a selective ion implantation of, for example, B, C, H, or O, which renders a conductive GaAs layer of the varicap diode to be semi-insulative.

Since the p-n junction of a varicap diode of the present invention can be obtained by a non-selective ion implantation without using a mask, the varicap diode of this invention can be free of said C drift and its manufacturing process can be made simple.

BRIEF DESCRIPTION OF THE DRAWINGS

FIGS. 2(a) to 2(d) illustrate how the diode of FIG. 1 can be made, wherein FIG. 2(a) shows a substrate, FIG. 2(b) shows the substrate on which impurity layers are formed, FIG. 2(c) shows the impurity-layered substrate into which a deep element isolation region is formed, and FIG. 2(d) shows a final product corresponding to the device of FIG. 1;

FIGS. 5(a) to 5(d) illustrate how the diode of FIG. 4 is made.

DETAILED DESCRIPTION OF THE PREFERRED EMBODIMENTS

In the following, a varicap diode (p-n junction diode) of this invention as well as a specific manufacturing method therefor will be described with reference to the accompanying drawings.

Figure 1:
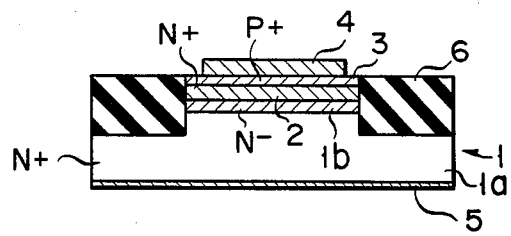
FIG. 1 is a sectional view showing a configuration of a varicap diode according to the present invention.

FIG. 1 shows a sectional view of a varicap diode according to the present invention. In the figure, low-concentration N$^-$ type layer 1b is epitaxially grown on high-concentration N$^+$ type GaAs substrate 1a, to thereby prepare substrate 1. High-concentration N$^+$ type first impurity layer 2 is provided on epitaxial N$^-$ layer 1b such that N$^+$ layer 2 has an area suitable for obtaining a designed capacitance. High-concentration P$^+$ type second impurity layer 3 is deposited onto N$^+$ layer 2. P$^+$ layer 3 is connected to ohmic electrode 4. The back plate of substrate 1a is connected to electrode 5.

Figures 4, 5:
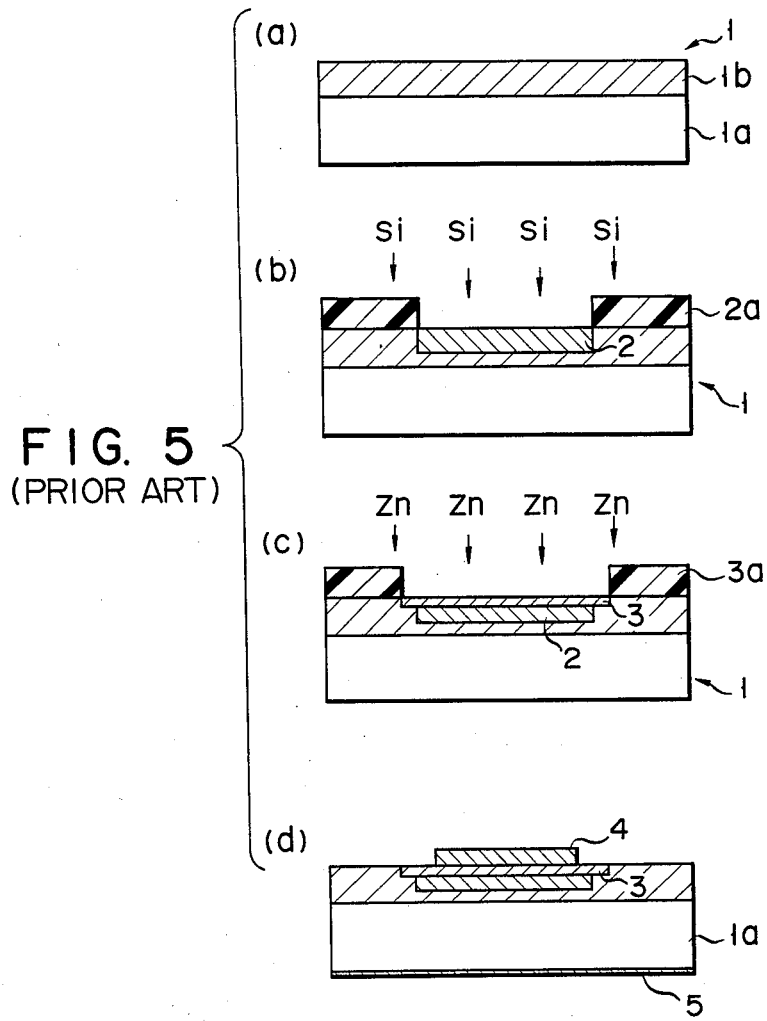
FIG. 4 is a sectional view showing a configuration of a conventional varicap diode.

The above configuration is substantially the same as that shown in FIG. 4.

The key feature of this invention resides in a specific use of semi-insulative element isolation region 6. The depth of region 6 in substrate 1 is deeper than the total depth of layers 2 and 3. The pattern of region 6 is designed such that the p-n junction capacitance area encircled by region 6 becomes a predetermined value. The semi-insulating processing for isolation region 6 is performed such that the electrical resistance of region 6, which intersects non-selectively formed first and second impurity layers 2 and 3, is materially increased by doping impurities of boron B, carbon C, hydrogen H, oxygen O, or the like.

FIGS. 2(a) to 2(d) illustrate how the varicap diode (p-n junction diode) of FIG. 1 is manufactured.

First, as shown in FIG. 2(a), low-concentration N$^-$ type GaAs layer 1b is deposited, by means of an epitaxial growth, on high-concentration N$^+$ type GaAs substrate 1a.

Next, as shown in FIG. 2(b), N type impurities silicon Si and P type impurities zinc Zn are ion-implanted on the whole area of epitaxial layer 1b of substrate 1, without using a mask. This Si ion implantation can be performed with an acceleration voltage of 180 keV and a dose amount of $3 \times 10^{12}$ cm$^{-2}$. The following Zn ion implantation for the whole area can be performed with an acceleration voltage of 80 keV and a dose amount of $1 \times 10^{15}$ cm$^{<2}$. Then, in an atmosphere of AsH$_3$ gas at 850° C., the device of FIG.2(b) is annealed for 20 minutes so that high-concentration N$^+$ type impurity layer 22a and high-concentration P$^+$ type impurity layer 23a are formed on the whole area of the device.

Next, as shown in FIG. 2(c), resist film 24 having patterning apertures for element isolation regions (6) are formed. This resist film formation can be performed using a conventional photo lithography method. The area of the patterning aperture is so determined that the p-n junction area between layers 2 and 3 becomes suitable for obtaining a target capacitance.

Using the above resist film, boron B is selectively ion-implanted into the device of FIG. 2(c). This selective ion implantation can be performed with an acceleration voltage of 300 KeV and a dose amount of $1 \times 10^{14}$ cm$^{-2}$. Then, semi-insulative, element isolation region 6 which encompasses the varicap diode structure is obtained. This varicap diode is formed at the p-n junction of first and second impurity layers 22 and 23.

Finally, as shown in FIG. 2(d), ohmic electrode 4 connected to layer 23 is formed, by a conventional lift-off method or etching method, using titanium Ti on which aluminum Al is evaporated. Further, back plate electrode 5 ohmically connected to substrate 1a is formed, by a conventional evaporation method and alloy method, using gold-germanium composition AuGe.

According to the manufacturing method of FIGS. 2(a) to 2(d), a conventional mask forming process for a selective ion implantation can be omitted, so that the manufacturing process of a varicap diode is simplified.

FIGS. 3(a) to 3(d) show a second embodiment of this invention. In this embodiment, explanations for two manufacturing steps in FIGS. 3(a) and 3(b), being equivalent to those of FIGS. 2(a) and 2(b), are omitted for the purpose of simplicity.

According to the second embodiment, as shown in FIG. 3(c), ohmic electrode 34 for second impurity layer 33 is formed. The patterning for electrode 34 can be performed by a lift-off method for an evaporated Ti/Al film which is formed on a resist film having a side-etched figure. This patterning can also be performed by a chemical etching using an NaOH solution and a fluorine acetic acid solution.

Using formed electrode 34 as a mask, and under the same conditions as in the case of the former embodiment, boron B is ion-implanted into the device of FIG. 3(c), so that semi-insulated element isolation region 36 is formed.

Then, as shown in FIG. 3(d), back plate electrode 5 is formed under the same condition as in the case of the former embodiment.

The second embodiment is advantageous over the first embodiment in that the formation of ohmic electrode 34 can be self-aligned with element isolation region 36.

A varicap diode (or p-n junction diode structure) of this invention can be free of film stress in masks 2a and 3a as shown in FIGS. 5(b) and 5(c) because this invention does not require such masks. For this reason, a varicap diode of this invention has no C drift, thereby avoiding inconvenience such as a tuning frequency shift of a TV tuner which uses a varicap diode for its tuning resonance circuit.

Further, since the present invention does not require the above masks for selective ion implantations, the manufacturing process of this invention can be simpler than that of a conventional one.

Figure 2:
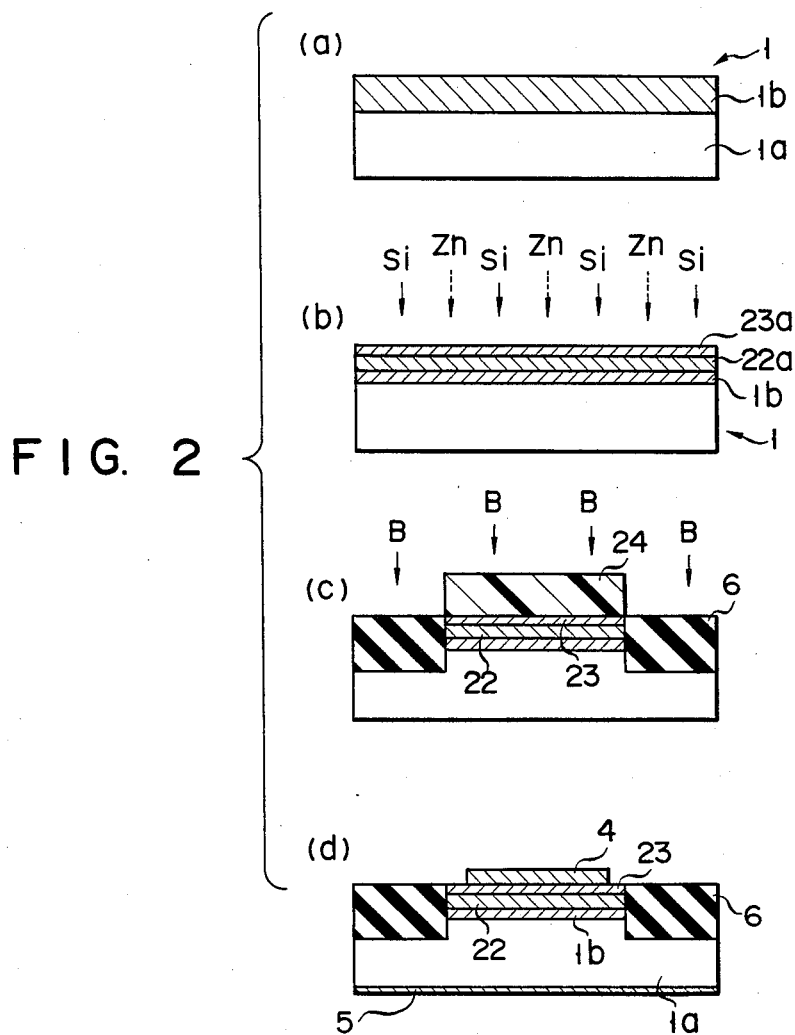
Figure 3:
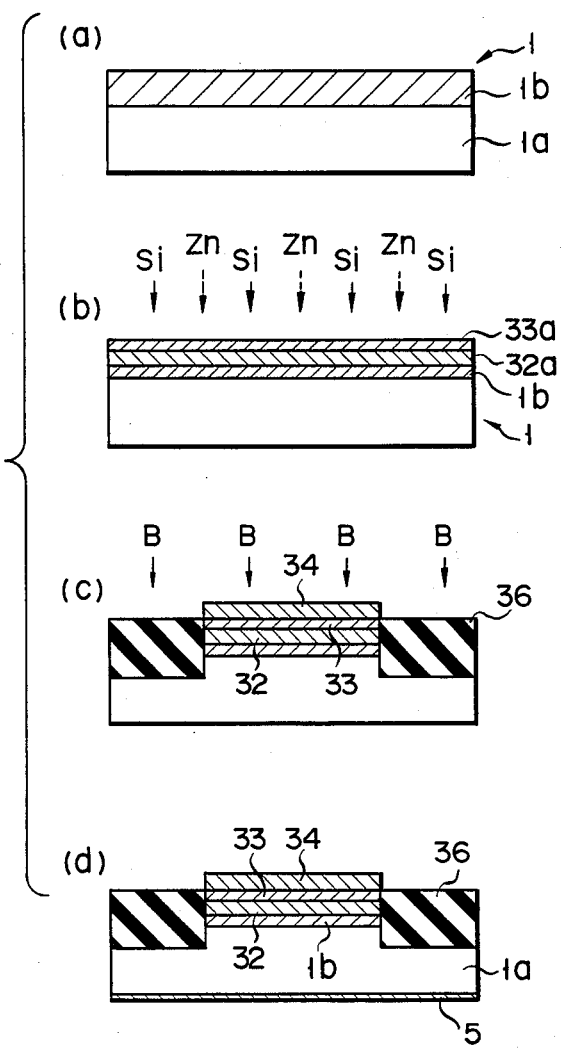
FIGS. 3(a) to 3(d) illustrate another method of obtaining a final product which is an improvement of the device of FIG. 1.

Incidentally, reference numeral 2 in FIG. 1 corresponds to numeral 22 in FIG. 2 and to numeral 32 in FIG. 3, numeral 6 in FIG. 1 or 2 corresponds to numeral 36 in FIG. 3, numeral 3 in FIG. 1 corresponds to numeral 23 in FIG. 2 and to numeral 33 in FIG. 3, and numeral 4 in FIG. 1 or 2 corresponds to numeral 34 in FIG. 3.

While the invention has been described in connection with what is presently considered to be the most practical and preferred embodiment, it is to be understood that the invention is not limited to the disclosed embodiment but, on the contrary, is intended to cover various modifications and equivalent arrangements included within the scope of the appended claims, which scope is to be accorded the broadest interpretation so as to encompass all such modifications and equivalent arrangements.

What is claimed is:

1. A method for manufacturing a GaAs planar diode comprising the steps of:
   (a) forming a low-concentration first conductivity GaAs layer on a high-concentration first conductivity GaAs layer, to thereby provide a first conductivity substrate;
   (b) implanting a first kind of ion into a whole area of said low-concentration first conductivity GaAs layer, so that a first impurity layer of the high-concentration first conductivity type is formed on the whole area of said low-concentration first conductivity GaAs layer;
   (c) implanting a second kind of ion into a whole area of said first impurity layer, so that a second impurity layer of a high-concentration second conductivity type is formed on the whole area of said first impurity layer;
   (d) forming a mask for patterning a predetermined area of said second impurity layer, first impurity layer, and low-concentration first conductivity GaAs layer;
   (e) selectively-implanting predetermined atoms into said substrate except for the patterned predetermined area of said mask, so that a semi-insulation region serving as an element isolation region is formed around the patterned predetermined area of said mask, the depth of said semi-insulation region in said substrate having said first and second impurity layers being deeper than the total depth of said first ipurity layer, second impurity layer, and low-concentration first conductivity GaAs layer.

2. A method according to claim, 1 wherein said semi-insulation region includes an element selected from the group consisting of boron (B), carbon (C), hydrogen (H), and oxygen (O).

3. A method according to claim, 1 wherein said first impurity layer includes silicon (Si).

4. A method according to claim, 1 wherein said second impurity layer includes zinc (Zn).

5. A method for manufacturing a GaAs planar diode comprising the steps of:
   (a) forming a low-concentration first conductivity GaAs layer on a high-concentration first conductivity GaAs layer, to thereby provide a first conductivity substrate;
   (b) implanting a first kind of ion into a whole area of said low-concentration first conductivity GaAs layer, so that a first impurity layer of the high-concentration first conductivity type is formed on the whole area of said low-concentration first conductivity GaAs layer;
   (c) implanting a second kind of ion into a whole area of said first impurity layer, so that a second impurity layer of a high-concentration second conductivity type is formed on the whole area of said first impurity layer;
   (d) forming a first electrode on said second impurity layer, for patterning a predetermined area of said second impurity layer, first impurity layer, and low-concentration first conductivity GaAs layer, said first electrode ohmically contacting said second impurity layer;
   (e) selectively implanting predetermined atoms into said substrate except for the patterned predetermined area of said first electrode, so that a semi-insulation region serving as an element isolation region is formed around the patterned predetermined area of said first electrode, the depth of said semi-insulation region in said substrate being deeper than the total depth of said first impurity layer, second impurity layer, and low-concentration first conductivity GaAs layer.

6. A method according to clam 5, wherein said semi-insulation region includes an element selected from the group consisting of boron (B), carbon (C), hydrogen (H), and oxygen (O).

7. A method according to claim 5, wherein said second impurity layer includes zinc (Zn).

* * * * *